(12) United States Patent
Nemeyer

(10) Patent No.: US 9,574,759 B2
(45) Date of Patent: Feb. 21, 2017

(54) ADJUSTABLE LASER ILLUMINATION PATTERN

(71) Applicant: Laser Devices, Inc., Monterey, CA (US)

(72) Inventor: Adam Nemeyer, Gilroy, CA (US)

(73) Assignee: Steiner eOptics, Inc., Monterey, CA (US)

( * ) Notice: Subject to any disclaimer, the term of this patent is extended or adjusted under 35 U.S.C. 154(b) by 4 days.

(21) Appl. No.: 14/598,772

(22) Filed: Jan. 16, 2015

(65) Prior Publication Data

US 2016/0208988 A1    Jul. 21, 2016

(51) Int. Cl.
*F21V 29/70*     (2015.01)
*H01S 5/00*      (2006.01)
*G02B 27/09*     (2006.01)

(52) U.S. Cl.
CPC .......... *F21V 29/70* (2015.01); *G02B 27/0955* (2013.01); *G02B 27/0988* (2013.01); *H01S 5/00* (2013.01)

(58) Field of Classification Search
CPC ... F21K 9/50; F21K 9/00; F21V 29/70; F21V 5/04; F21V 17/00; F21V 29/502; F21V 29/503; F21V 29/02; F21V 99/00; G02B 27/095; F21Y 2101/025; F21Y 2115/30; H05S 5/00
See application file for complete search history.

(56) References Cited

U.S. PATENT DOCUMENTS

| 4,519,020 | A   | 5/1985  | Little          |
| 5,685,105 | A   | 11/1997 | Teetzel         |
| 5,816,683 | A   | 10/1998 | Christiansen    |
| 6,244,730 | B1  | 6/2001  | Goldberg et al. |
| 6,414,672 | B2  | 7/2002  | Rekimoto et al. |
| 6,866,401 | B2  | 3/2005  | Sommers et al.  |
| 7,726,061 | B1  | 6/2010  | Thummel         |
| 7,784,192 | B2* | 8/2010  | Jancic ........................ F41G 1/35 33/286 |
| 8,607,492 | B2* | 12/2013 | Hartley .................... F41C 23/16 42/72 |
| 8,833,994 | B2  | 9/2014  | Nemeyer         |

(Continued)

OTHER PUBLICATIONS

Hecht, Optics (ISBN: 0805385665), 4th edition, pp. 171-175, 194-195.

*Primary Examiner* — Bao Q Truong
(74) *Attorney, Agent, or Firm* — Innovation Counsel LLP

(57) ABSTRACT

A laser illuminator emitting a circular profile of substantially uniform intensity is presented. The laser illuminator may include a heat sink configured to optically couple to a laser light source. The heat sink may include a beam dump cavity configured to absorb light from the laser light source, and a circularizer aperture having a cylindrical, flat-top opening and being configured to shape a portion of laser light emitted from the laser light source to exit the heat sink. The laser illuminator may also include a collimation lens configured to collect the light exited from the heat sink and provide a focused beam of light, and a scatter clean-up aperture optically coupled to the collimation lens. The scatter clean-up aperture may be configured to absorb scatter laser light rays, and provide from the focused beam of light an output beam of light comprising a circular profile of substantially uniform intensity.

19 Claims, 8 Drawing Sheets

(56) References Cited

U.S. PATENT DOCUMENTS

| | | | |
|---|---|---|---|
| 8,898,915 B2* | 12/2014 | Cheng | G01C 15/002 |
| | | | 33/286 |
| 9,395,066 B2 | 7/2016 | Nemeyer | |
| 2005/0254233 A1 | 11/2005 | Alessio | |
| 2012/0120662 A1 | 5/2012 | Duong et al. | |
| 2012/0287621 A1 | 11/2012 | Lee et al. | |
| 2012/0287638 A1* | 11/2012 | Chen | F21V 5/04 |
| | | | 362/259 |
| 2013/0182441 A1* | 7/2013 | Nemeyer | F21L 4/005 |
| | | | 362/277 |
| 2013/0235609 A1 | 9/2013 | Nemeyer | |

\* cited by examiner

ADJUSTABLE LASER ILLUMINATION PATTERN

TECHNICAL FIELD

The subject matter disclosed herein generally relates to optical devices. In some embodiments, the present disclosures relate to systems and methods for providing an adjustable laser illumination pattern.

BACKGROUND

Laser illuminator devices may be used to illuminate a focused area using laser light. Some uses include supplying night vision in search and rescue, hunting, and illuminating other targets. Laser illuminators may supply a focused beam of light to an area ranging from the size of a golf ball to a small automobile. The area of illumination may be adjusted by the illuminator device in some cases. Laser illuminators may illuminate a target at a distance of dozens to thousands of meters away, depending on the power used. The shape of the light beam (e.g., the beam profile), however, may be uneven, or may illuminate a target with an uneven intensity. It may be desirable, therefore, to improve the beam profile to provide a more circular illumination area with a more even intensity.

BRIEF SUMMARY

Systems, methods, and apparatuses are presented for a laser illuminator device that emits a circular beam of light with a uniform distribution of beam intensity throughout the circular area (e.g. the beam has a "flat top" distribution).

In some embodiments, a laser illuminator is presented. The laser illuminator may be configured to emit laser light from a laser light source. The laser illuminator may also include a heat sink configured to be coupled to the laser light source, the heat sink including a beam dump cavity configured to absorb light from the laser light source, and a circularizer aperture having a cylindrical, flat-top opening that is configured to allow a portion of the laser light emitted from the laser light source to exit the heat sink, the laser light exiting the heat sink having a circular profile based on the cylindrical, flat-top opening. The laser illuminator may also include a collimation lens configured to collect the laser light exited from the heat sink and provide from the collected light a focused beam of light, and a lens holder coupled to the collimation lens and comprising a scatter clean-up aperture configured to: absorb scatter laser light rays diffracted from the focused beam of light, and provide from the focused beam of light an output beam of light having a circular profile of substantially uniform intensity. In some embodiments, the laser illuminator includes the laser light source.

In some embodiments, the laser light exiting the heat sink of the laser illuminator has a beam profile of substantially uniform intensity.

In some embodiments, the circularizer aperture of the laser illuminator is optically aligned with a center axis of the laser light source.

In some embodiments, the collimation lens of the laser illuminator is optically aligned with a center axis of the laser light source.

In some embodiments, the collimation lens of the laser illuminator is adjustable between a first position along a center axis aligned with the laser light source and a second position along the center axis.

In some embodiments, the focused beam of light of the laser illuminator has a divergence angle of 95 milliradians (mrads) when the collimation lens is positioned at the first position, and the focused beam of light has a divergence angle of 250 mrads when the collimation lens is positioned at the second position.

In some embodiments, the position of the collimation lens of the laser illuminator is continuously adjustable between the first and second positions.

In some embodiments, the laser light source of the laser illuminator includes one or more laser diodes.

In some embodiments, the one or more laser diodes of the laser illuminator is configured to emit laser light comprising a rectangular profile.

In some embodiments, the one or more laser diodes of the laser illuminator is configured to emit laser light comprising a Gaussian beam profile.

In some embodiments, the laser illuminator further includes a housing in which the laser light source, the heat sink, the collimation lens, and the lens holder are disposed, the housing being configured for attachment to a firearm. In some embodiments, the housing further includes a laser pointer. In some embodiments, the laser pointer is configured to provide aiming of a target and simultaneously, the laser illuminator is configured to provide illumination of the target.

In some embodiments, the collimation lens of the laser illuminator has a focal length of 8.91±0.15 millimeters.

In some embodiments, a method is presented. The method may include emitting laser light from a laser light source into a beam dump cavity of a heat sink, absorbing a first portion of the laser light into the heat sink through the beam dump cavity, allowing a second portion of the laser light to exit the heat sink through a circularizer aperture comprising a cylindrical, flat-top opening, the exited second portion of the laser light comprising a circular profile based on the cylindrical, flat-top opening, collecting the exited second portion of laser light in a collimation lens, the collimation lens housed in a lens holder, the lens holder comprising a scatter clean-up aperture, providing a focused beam of light to the scatter clean-up aperture based on the collected light of the collimation lens, absorbing scatter laser light rays diffracted from the focused beam of light by the scatter clean-up aperture, and providing an output beam of light through the scatter clean-up aperture based on the focused beam of light, the output beam of light comprising a circular profile of substantially uniform intensity.

In some embodiments, a heat sink is presented. The heat sink may include: a beam dump cavity positioned proximally to a laser light source and may be configured to receive laser light from the laser light source, and a circularizer aperture positioned distally to the laser light source and configured to emit light having a circular, flat-top beam profile.

In some embodiments, the heat sink is configured to optically couple to the laser light source.

In some embodiments, the circularizer aperture of the heat sink comprises a cylindrical, flat-top opening, and the circularizer aperture is configured to emit the light is defined by the cylindrical, flat-top opening.

In some embodiments, the circularizer aperture of the heat sink is aligned with a center axis of the laser light source, and the circularizer aperture is positioned 0.190±0.05 cm away from the laser light source.

In some embodiments, a lens holder is presented. The lens holder may include: a proximal aperture configured to receive light having a circular, flat-top beam profile from a distal aperture of a heat sink component, and a collimation lens configured to collect the light received from the heat sink and provide from the collected light a focused beam of light. The lens holder may define a distal aperture optically aligned with the collimation lens and configured to emit the focused beam of light having the circular, flat-top beam profile.

In some embodiments, the distal aperture of the lens holder is further configured to absorb scatter laser light rays diffracted from the focused beam of light.

In some embodiments, the lens holder may further include a chamber positioned between the collimation lens and the distal aperture, the chamber configured to allow at least a portion of the focused beam of light to converge upon reaching the distal aperture.

In some embodiments, the collimation lens of the lens holder is adjustable between a first position along a center axis aligned with the light received from the heat sink and a second position along the center axis.

BRIEF DESCRIPTION OF THE DRAWINGS

Some embodiments are illustrated by way of example and not limitation in the figures of the accompanying drawings.

DETAILED DESCRIPTION

Figure 1A:
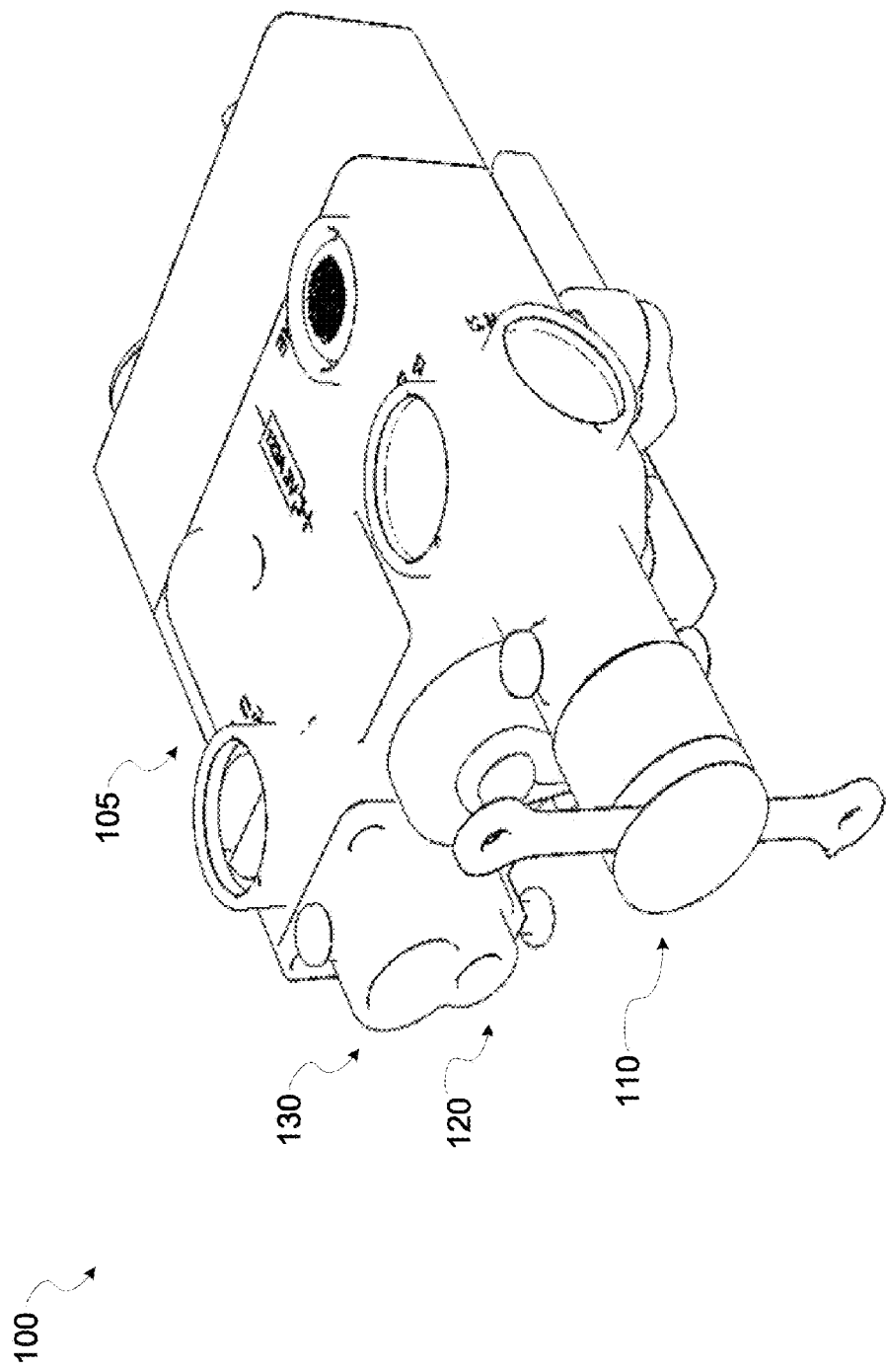
FIGS. 1A-1C show different perspective views of an example apparatus housing of a laser illuminator, according to some embodiments.

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention. As used in this specification and the appended claims, the singular forms "a," "an," and "the" include plural referents unless the context clearly indicates otherwise.

Example methods, apparatuses, and systems (e.g., machines) are presented for an adjustable infrared laser illuminator. Conventional laser illuminator devices are designed to illuminate a focused area using laser beam light. Often used to supply night vision in search and rescue, hunting, and other cases, laser illuminators may supply a focused beam of light to a circular area ranging from the size of a golf ball to a small automobile. The area of illumination may be adjusted by the illuminator device in some cases. Conventional devices may illuminate a target at a distance of dozens to thousands of meters away, depending on the power used.

The shape of the laser beam emitted from a laser illuminator tends to exhibit a Gaussian distribution profile, meaning the intensity of the light tends to be strongest toward the center of the beam, and gradually dissipates radially outward. In other words, the intensity of light of any radial cross-section of the beam through its center may be approximated by a Gaussian function (i.e., the intensity profile may look like a bell curve). In addition, typical laser illuminators tend to exhibit a rectangular-shaped beam in the far field (e.g., 100 meters away), in part due to the rectangular shape of the laser emitting diode from which the laser beam originates from. It may be desirable, however, to improve typical laser illuminator designs by providing an illumination profile with an even (e.g., uniform) distribution of light to a target, and in a more circular pattern.

Aspects of the present disclosure are presented for a laser illuminator device that emits a circular beam of light with a uniform distribution of beam intensity throughout the circular area (e.g., the beam has a "flat top" distribution). In some embodiments, the size of the beam illuminating a target in the far field (e.g., the beam divergence) may be adjustable. In some embodiments, the laser illuminator device may be mounted onto another apparatus, such as a firearm or a vehicle. In some embodiments, the laser illuminator may be coupled with other light-emitting devices, such as a laser pointer and/or a flood light device, in a single housing apparatus. In some embodiments, the laser illuminator may be housed in a standalone device. Throughout this disclosure, the term "proximal" is used to describe the laser beam source end of the laser illuminator device and the term "distal" is used to describe the laser beam emission end of the laser illuminator device.

Referring to FIG. 1A, illustration 100 shows an example apparatus housing a laser illuminator consistent with aspects of the present disclosure. For example, illustration 100 may display an example PEQ-15 dual beam aiming laser (DBAL) device 105. Here, the DBAL device 105 may include laser illuminator 110, which may be an example illumination device consistent with aspects of the present disclosure. The wavelength of the laser beam light may be any suitable wavelength, either in the visible or invisible light spectrum. In the example illustrated herein, the DBAL device 105 also may include an infrared (IR) laser pointer 120, which may be configured to project a highly-collimated (e.g., finely-focused) beam of IR laser light (e.g., light wavelength of 820-850 nanometers (nm)), similar to conventional laser pointers, for example, or may be configured to project light in other visible wavelengths. In addition, a visible aim laser 130 may be configured to project a highly-collimated beam of laser light more in the visible light spectrum (e.g., light wavelength of 605-665 nm). The beam divergence of the aiming lasers 120 and 130 may be 0.5 milliradians (mrads), for example, while the beam divergence of the laser illuminator 110 may be a minimum of 1 to 105 mrads, for example. The laser illuminator 110 may be used in combination with one or both of the aiming lasers 120 and 130, for example, to both aim and illuminate a target at the same time.

Figure 1B:
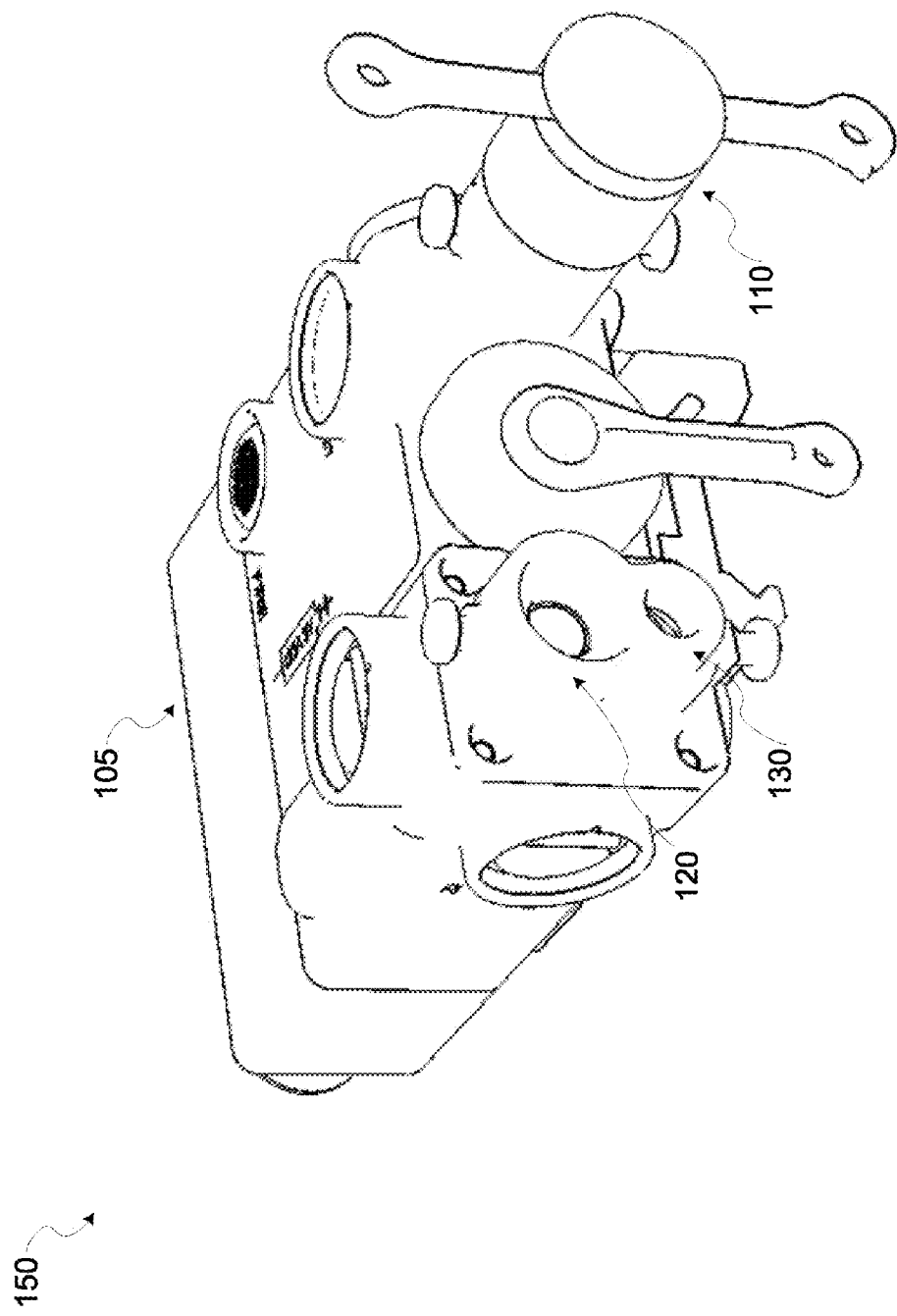
Figure 1C:
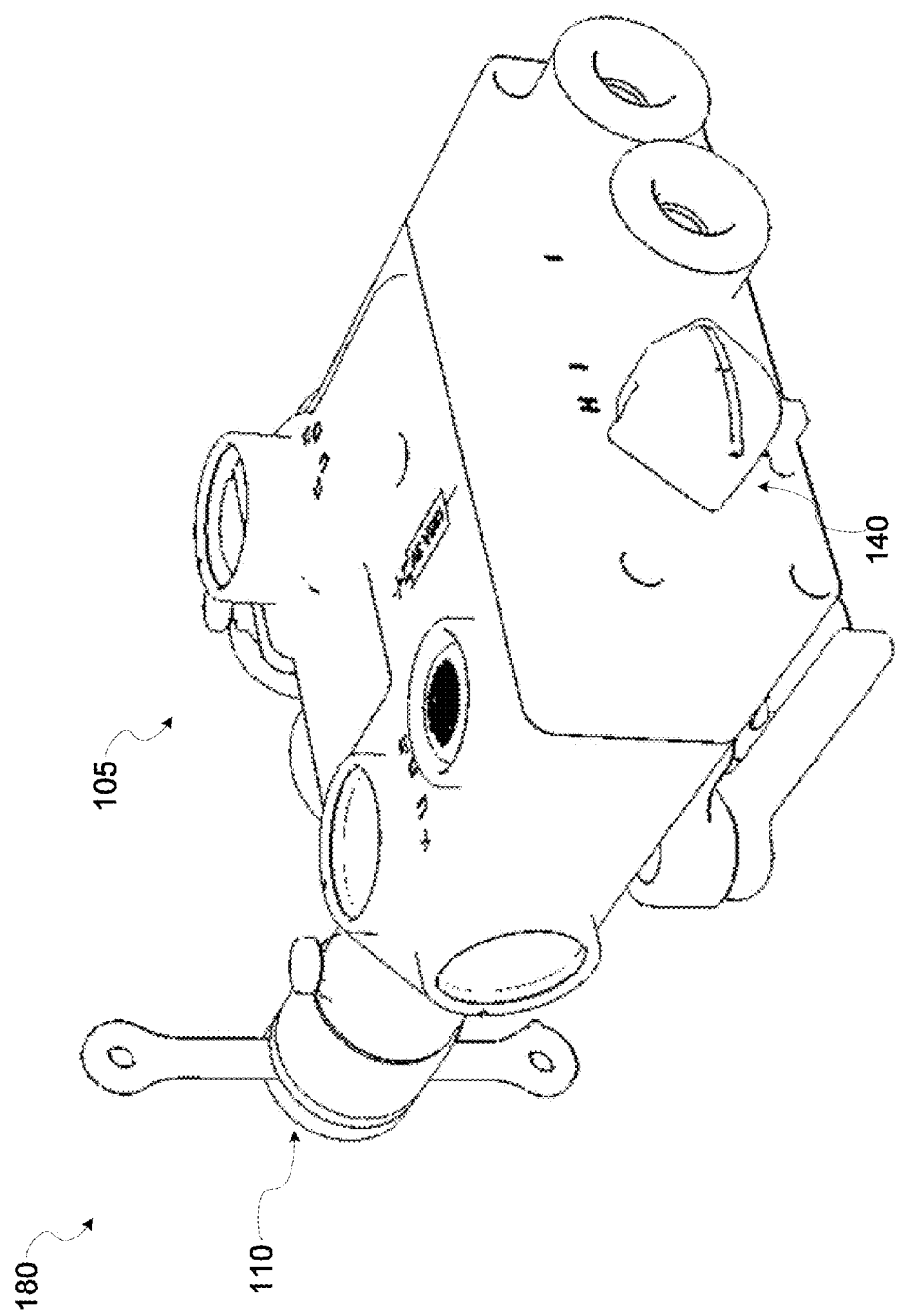

Referring to FIG. 1B, illustration 150 shows the example DBAL device 105 from an angle displaying the other side of the aiming lasers 120 and 130. Here, it can be seen that the exit aperture of the laser illuminator 110 may be larger than the exit apertures of the aiming lasers 120 and 130, consistent with the notion that the laser illuminator 110 is designed to illuminate a larger area, rather than simply point a focused beam of light at a target. Referring to FIG. 1C, illustration 180 shows the example DBAL device 105 from the back. Here, a power source 140 may be positioned in the back of the laser illuminator 110, and may be configured to supply laser light through a laser light source, such as a laser diode housed inside, for example. Other laser light sources apparent to those with skill in the art may be used to supply laser light, and embodiments are not so limited.

Figure 2:
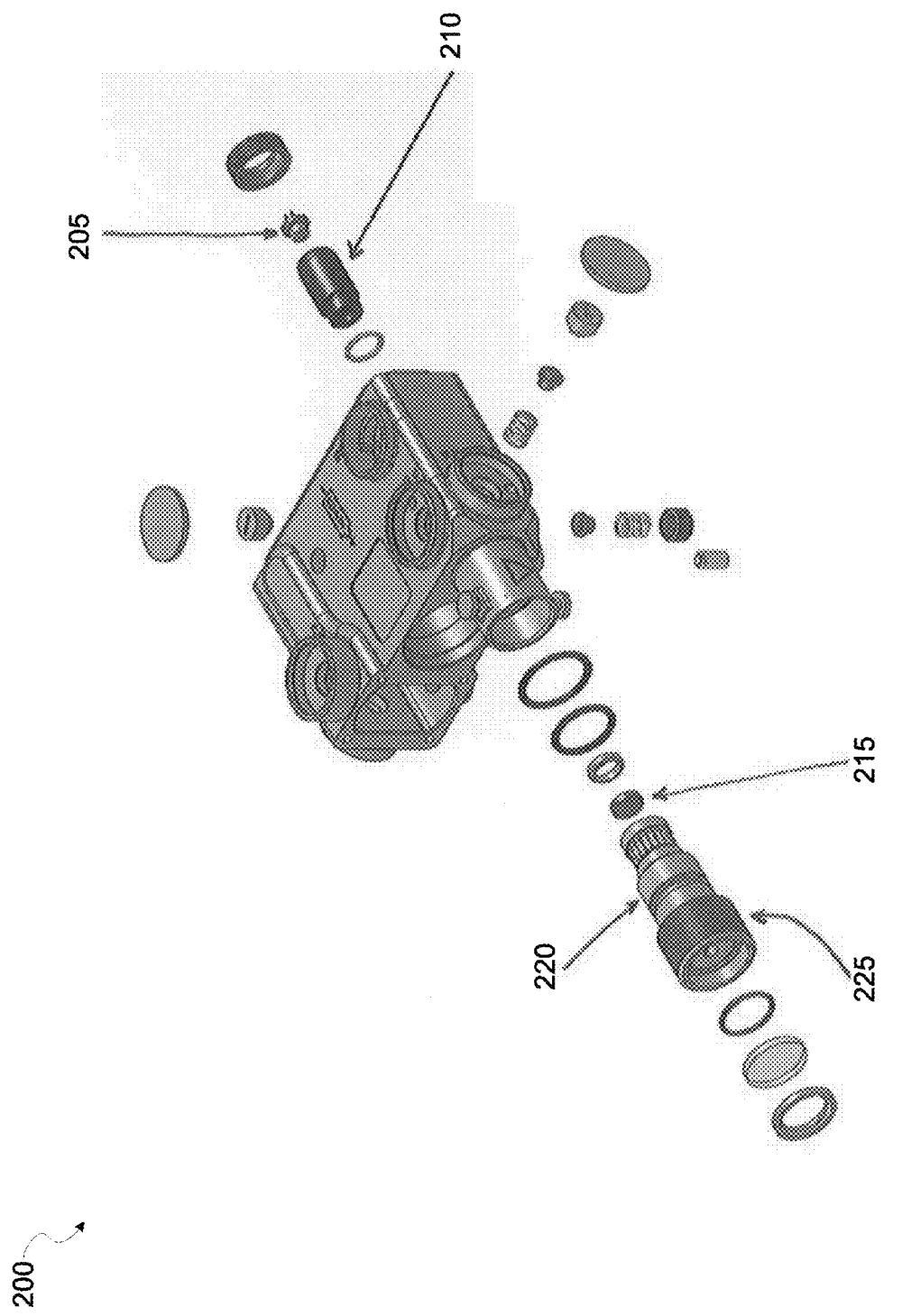
FIG. 2 shows an illustration of an exploded view of a laser illuminator within an example dual beam aiming laser (DBAL) device, according to some embodiments.

Referring to FIG. 2, in conjunction with FIGS. 1A-1C, illustration 200 shows an exploded view of the laser illuminator 110 within the example DBAL device 105, shown in FIGS. 1A-1C, according to some embodiments. Here, the laser illuminator 110 includes a laser diode 205 connected to a laser diode heat sink and beam dump 210, toward the proximal end of the illuminator 110, among other various components. The laser diode 205 may be configured to emit laser light of any suitable wavelength, either in the visible or invisible spectrum. Suitable wavelengths may include, for example, short wavelength infrared, near infrared, and visible wavelengths. In some cases, the laser diode 205 may be selectable between two or more wavelengths, and embodiments are not so limited. The heat sink and beam dump 210 may include a circular aperture configured to emit the light from the light diode 205, which will be described more below. In addition, the illuminator 110 may include a collimation lens 215 attached to the other side of the main housing of the DBAL device 105. A lens holder 220 may be attached to the collimation lens and positioned into the distal end of the housing of the DBAL device 105. In some embodiments, an adjuster 225 may allow for an adjustable beam divergence of the laser diode 205. For example, the adjuster 225 may allow for an adjustable range of 95 mrads to 250 mrads of beam divergence. Other parts as shown include screws, springs, and caps to fasten the aforementioned parts reliably into the main housing of the DBAL device 105.

Figure 3A:
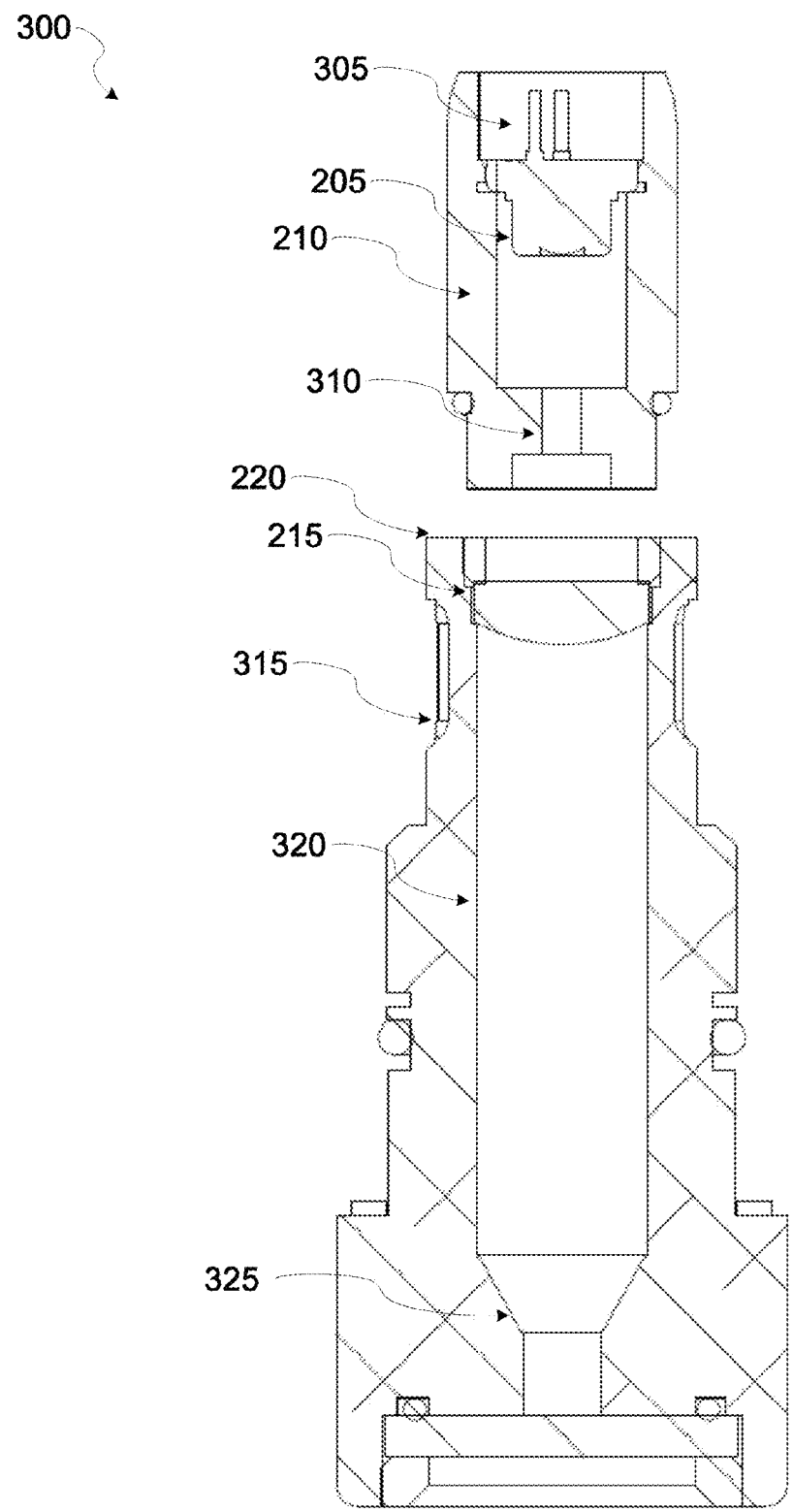
FIG. 3A shows a schematic view of a longitudinal cross section of a laser illuminator, according to some embodiments.

Referring to FIG. 3A, illustration 300 shows a schematic view of the illuminator 110, consistent with the illustrations in FIGS. 1A, 1B, 1C, and 2, according to some embodiments. Illustration 300 may show a longitudinal cross section of the laser illuminator 110, where the illuminator 110 portion may be designed in a cylindrical shape. The top of the illustration 300 may represent the proximal end of the illuminator 110.

Still referring to FIG. 3A, the illuminator 110 may receive power from electrical conductors, e.g., diode wires, not shown, which are electrically connected to diode connectors 305. The diode wires may supply electrical power to the illuminator 110. The diode connectors 305 apply electrical power to the laser diode 205, which may be housed within the laser diode heat sink and beam dump 210, as shown. In some embodiments, the laser diode may be an infrared laser diode, whereas in other embodiments, the laser diode may operate at other wavelengths. The heat sink and beam dump 210 may be configured to initially receive laser light emitted from the laser diode 205, as well as absorb light and heat. The laser 205 may not be shaped or directed initially, and thus may project light in an unfocused manner at first. For example, light from the laser diode 205 may be emitted at an angle of up to 8 degrees on the slow axis and up to 24 degrees on the fast axis.

The heat sink and beam dump 210 also may include a laser diode flat-top and circularizer aperture 310, which may allow a portion of the light emitted from the laser diode 205 to exit the heat sink and beam dump 210. The circularizer aperture may be shaped cylindrically, so as to allow the light exiting the heat sink and beam dump 210 to be shaped in a circular profile. In some embodiments, the circularizer aperture 310 is polished and anodized. In addition, in some cases the circularizer aperture 310 is painted (e.g., Class 3 black) to allow for smooth emission of desired laser light. The laser diode 205 being housed within the heat sink and beam dump 210 also may allow for a proper alignment of the center axis of the laser diode 205 with the circularizer aperture 310, which may be built into the heat sink and beam dump 310.

In some embodiments, the circularizer aperture 310 may be spaced a fixed distance away from the emitter of the laser diode 205 such that the light from the laser diode 205 may exit the heat sink and beam dump 210 at a substantially uniform intensity throughout the area of the circularizer aperture 310. For example, when the circularizer aperture 310 is spaced too far away from the laser diode 205, a uniform intensity of light may not be achievable due to the Gaussian profile of the light emissions from the laser diode 205. On the other hand, when the circularizer aperture 310 is spaced too closely to the laser diode 205, the laser diode 205 may not emit light at a wide enough angle before the light reaches the circularizer aperture, also resulting in an uneven profile. In general, the circularizer aperture 310 being spaced too close or too far away from the laser diode 205 may result in an uneven and possibly rectangular beam profile as the light exits the heat sink and beam dump 210.

The illuminator 110 also may include a lens holder 220, which may be configured to further shape the light from the laser diode 205. The lens holder 220 may include a collimation lens 215, which may be configured to defocus the light rays exited from the circularizer aperture 310. In some embodiments, the collimation lens 215 has an 830 nm coating, which provides scratch protection and affects the refractive index of the lens. The collimation lens may be positioned far enough away from the circularizer aperture so as to defocus a flat-top, circular beam profile. In some embodiments, the collimation lens 215 may be configured to defocus light at a 95 mrad divergence angle. In some embodiments, the collimation lens 215 may be adjustable, for example, moved as far back as to position 315, allowing for a wider divergence angle, e.g., up to 250 mrads.

The lens holder 220 may also include a hollow column 320 for light to pass through, the hollow column 320 connected to a scatter clean-up aperture 325. As the light passes through the collimation lens 215, some scatter beams of light may still remain. The scatter clean-up aperture 325 may therefore be designed to block scatter rays from exiting the lens holder 220 and allow only the desired focused light to exit. Accordingly, collimation lens 215 may have an effective focal length equal to the distance away from the scatter clean-up aperture. For example, in some embodiments, the focal length of the collimation lens may be 8.91±0.15 mm.

Figure 3B:
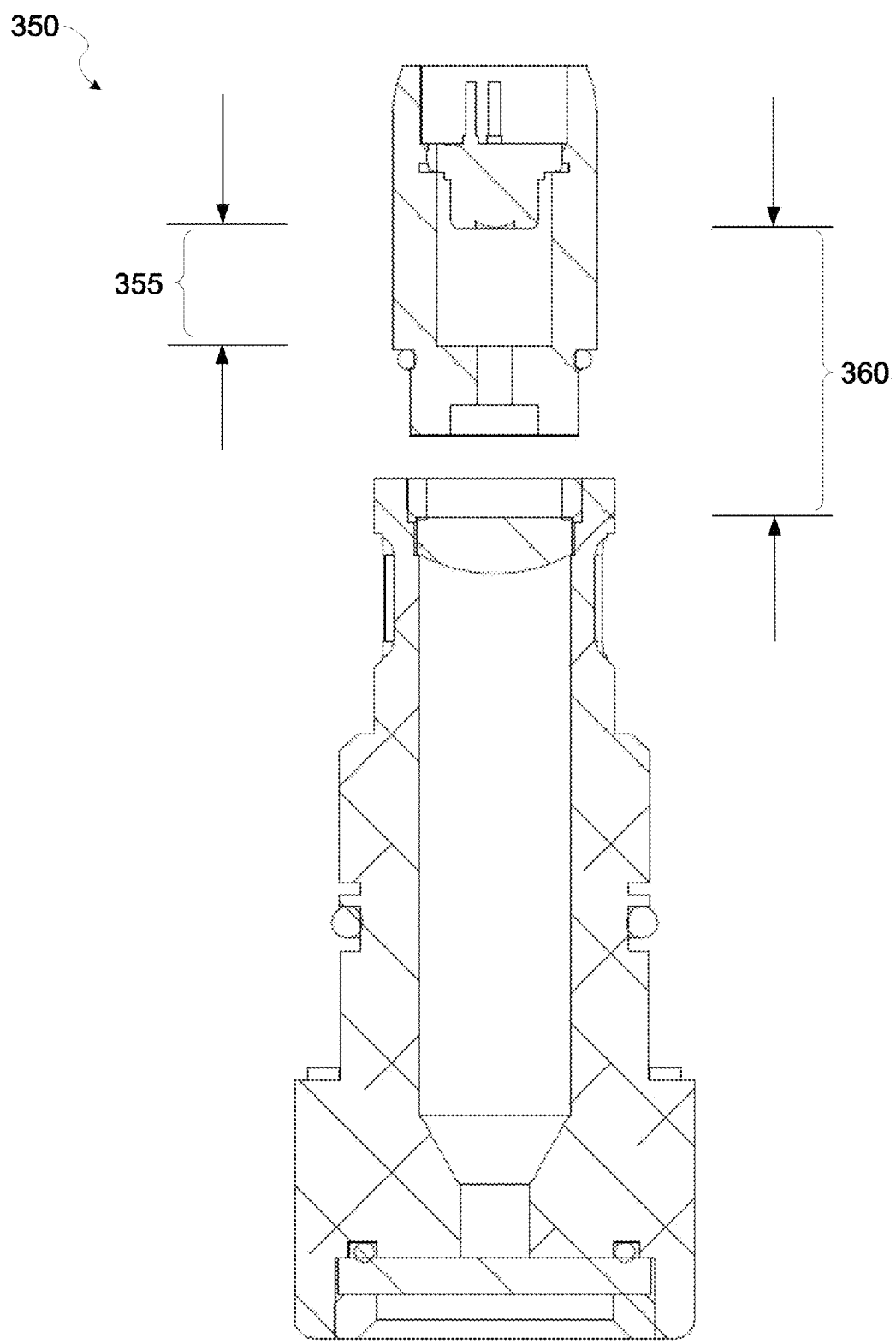
FIG. 3B shows an illustration of the schematic view of the laser illuminator with certain distances between certain objects emphasized, according to some embodiments.

Referring to FIG. 3B, in some embodiments, the distance 355 between the end of the laser diode 205 and the beginning of the circularizer aperture 310 is calibrated and may be dependent on the power and beam profile shape of the laser diode 205. For example, in some embodiments, based on a 15 milliwatt laser diode 205 with a conventional rectangular emission profile, the distance 355 may be 0.190 inches. In addition, the distance 360 between the end of the laser diode 205 and the beginning of the collimation lens 215 may be calibrated and may be dependent on the power and beam profile shape of the laser diode 205. In some embodiments, the distance 360 may also be dependent on the diameter and length of the circularizer aperture 310. For example, in some embodiments, based on a 15 milliwatt laser diode 205 with a conventional rectangular emission profile, the distance 360 may be 0.467 inches.

Figure 4:
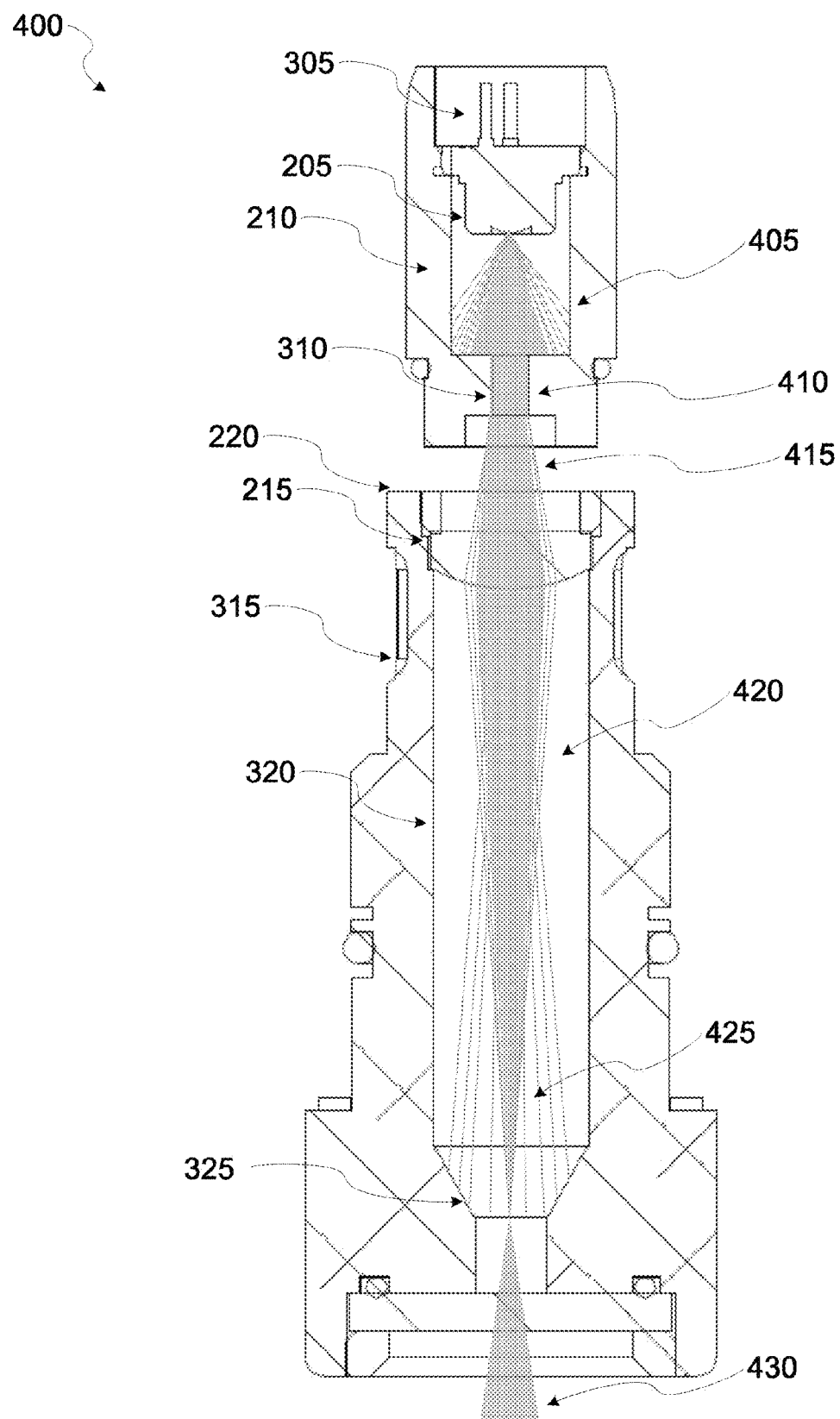
FIG. 4 shows an example beam emission profile through the laser illuminator, according to some embodiments.

Referring to FIG. 4, illustration 400 shows an example beam emission profile from the laser diode 205 through the illuminator apparatus 110, according to some embodiments. The example beam emission profile may illustrate how a progression of light rays emitted from the laser diode 205 pass through the different components of the laser illuminator 110, resulting in a circular, flat-top beam profile of uniform intensity, as shown, for example in FIG. 5.

Referring back to FIG. 4, for example, with the laser diode 205 having its center axis properly aligned with the circularizer aperture 310 of the heat sink and beam dump 210, the laser diode 205 may emit laser light having an example broad scatter distribution 405, as shown. Some of the rays will hit the sides of the chamber within the heat sink and beam dump 210, and will ultimately be absorbed by the heat sink and beam dump 210. The remaining rays will exit through the circularizer aperture, namely, primarily those rays with a trajectory directed at and through the circularizer aperture 310. Even though the laser diode 205 may emit light in a rectangular or other non-circular profile, because the circularizer aperture has a cylindrical shape, the light rays travel through the circularizer aperture with a cylindrical profile 410, and the excess rays are blocked and ultimately absorbed by the heat sink. Provided the circularizer aperture is positioned at a sufficient distance away from the laser diode 205, in some cases based on the power of the laser diode 205, the intensity of the rays 410 will also be substantially uniform. In some embodiments, the circularizer aperture 310 and other portions within the beam dump chamber portion may be painted black, reducing reflections of light emissions from laser diode 205 and thereby better controlling what rays exit through the circularizer aperture 310.

Upon exiting the circularizer aperture 310, the light rays have a circular profile, but may be emitted in more of a cone shape 415, in part due to diffraction. Some scatter rays may form on the outer edges of the beam profile 415. From here, the collimation lens 215 housed within the lens holder 220 may receive the light rays and refocus the rays down the hollow column 320 in a focused cone shape profile 420. In some embodiments, the collimation lens 215 may be configured to be adjustable, e.g., moved down to position 315. The cone-shaped profile 420 of the light rays may then be shaped proportionally, where the collimation lens 215 may be configured to still refocus the light rays into the scatter clean-up aperture 325. Within the hollow column 320, due to diffraction and other optical properties of the illuminator 110, some scatter rays may still remain after refocusing by the collimation lens 215, as illustrated by the scatter rays 425. The scatter clean-up aperture 325 may then be configured to filter just the focused portion of the light rays from beam profile 420, blocking any scatter rays 425. The resulting output 430 of the illuminator 110 may include a beam with a circular, flattop profile of substantially uniform intensity.

Figure 5:
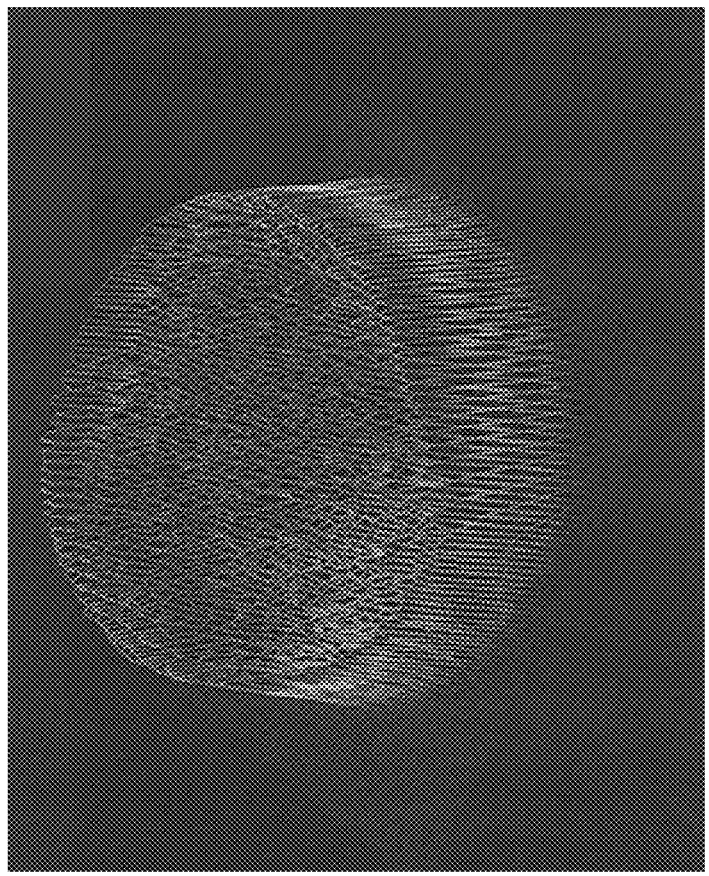
FIG. 5 is an illustration of an example cross-sectional beam intensity measurement of an output of the laser illuminator, according to some embodiments.

Referring to FIG. 5, illustration 500 shows an example cross-sectional beam intensity measurement of an output of an illuminator, according to some embodiments. As shown, it may be evident that the beam is shaped in a circular pattern, and that the intensity at each unit area of the beam, as indicated by the height per unit area, has a substantially flat top. This indicates that the intensity of the beam is substantially uniform, rather than exhibiting a Gaussian and/or rectangular profile, for example, as may be the case with conventional laser illuminators.

In some embodiments, the laser diode 205 may be configured to emit laser light with more or less power than examples described, and embodiments are not so limited. In some embodiments, based on the power of the laser diode 205, persons of skill in the art will appreciate that the circularizer aperture 310, collimation lens 215, and scatter clean-up aperture 325 may be spaced proportionately thereof to allow for the beam profile of laser diode 205 to be shaped appropriately to a circular flat top with substantially uniform intensity.

The following enumerated descriptions define various example embodiments of methods, machine-readable media, and systems (e.g., apparatus) discussed herein:

1. A method comprising:
emitting laser light from a laser light source into a beam dump cavity of a heat sink;
absorbing a first portion of the laser light into the heat sink through the beam dump cavity;
allowing a second portion of the laser light to exit the heat sink through a circularizer aperture comprising a cylindrical, flat-top opening, the exited second portion of the laser light comprising a circular profile based on the cylindrical, flattop opening;
collecting the exited second portion of laser light in a collimation lens, the collimation lens housed in a lens holder, the lens holder comprising a scatter cleanup aperture;
providing a focused beam of light to the scatter clean-up aperture based on the collected light of the collimation lens;
absorbing scatter laser light rays diffracted from the focused beam of light by the scatter clean-up aperture; and
providing an output beam of light through the scatter clean-up aperture based on the focused beam of light, the output beam of light comprising a circular profile of substantially uniform intensity.

The method of description 1, wherein the laser light exiting the heat sink further comprises a beam profile of substantially uniform intensity.

The method of description 1, wherein the circularizer aperture and the collimation lens are optically aligned with a center axis of the laser light source.

The method of description 1, wherein the laser light source includes one or more laser diodes.

The method of description 1, wherein the emitted light from the one or more laser diodes comprises a rectangular and Gaussian beam profile.

The method of description 1, further comprising illuminating a target with the output beam of light and simultaneously aiming at the target using a laser pointer.

The present disclosure is illustrative and not limiting. Further modifications will be apparent to one skilled in the art in light of this disclosure and are intended to fall within the scope of the appended claims.

What is claimed is:

1. A laser illuminator comprising:
a heat sink configured to optically couple to a laser light source, the heat sink comprising:
a beam dump cavity configured to absorb light from the laser light source; and
a circularizer aperture comprising a cylindrical, flat-top opening, the circularizer aperture configured to shape a portion of laser light emitted from the laser light source to exit the heat sink having a circular profile defined by the cylindrical, flat-top opening;

a collimation lens configured to collect the laser light exited from the heat sink and provide from the collected light a focused beam of light; and a scatter clean-up aperture optically coupled to the collimation lens, the scatter clean-up aperture configured to:

absorb scatter laser light rays scattered from the focused beam of light; and provide from the focused beam of light an output beam of light comprising a circular profile of substantially uniform intensity.

2. The laser illuminator of claim 1, wherein the heat sink is further configured to produce a beam profile of substantially uniform intensity.

3. The laser illuminator of claim 1, wherein the circularizer aperture is optically aligned with a center axis of the laser light source.

4. The laser illuminator of claim 1, wherein the collimation lens is optically aligned with a center axis of the laser light source.

5. The laser illuminator of claim 1, wherein the collimation lens is adjustable between a first position along a center axis aligned with the laser light source and a second position along the center axis.

6. The laser illuminator of claim 5, wherein the focused beam of light has a divergence angle of 95 milliradians (mrads) when the collimation lens is positioned at the first position, and the focused beam of light has a divergence angle of 250 mrads when the collimation lens is positioned at the second position.

7. The laser illuminator of claim 6, wherein the position of the collimation lens is continuously adjustable between the first and second positions.

8. The laser illuminator of claim 1, further comprising the laser light source.

9. The laser illuminator of claim 8, wherein the laser light source includes one or more laser diodes.

10. The laser illuminator of claim 9, wherein the one or more laser diodes is configured to emit laser light comprising a rectangular profile.

11. The laser illuminator of claim 10, wherein the one or more laser diodes is configured to emit laser light comprising a Gaussian beam profile.

12. The laser illuminator of claim 1, further comprising a housing in which the laser light source, the heat sink, the collimation lens, and the lens holder are disposed, the housing configured for attachment to a firearm.

13. The laser illuminator of claim 12, wherein the housing further comprises a laser pointer.

14. The laser illuminator of claim 13, wherein the laser pointer is configured to provide aiming of a target and simultaneously, the laser illuminator is configured to provide illumination of the target.

15. The laser illuminator of claim 1, wherein the collimation lens comprises a focal length of 8.91.±0.15 millimeters.

16. A lens holder comprising:

a proximal aperture configured to receive light having a circular, flat-top beam profile from a distal aperture of a heat sink component; and a collimation lens configured to collect the light received from the heat sink component and provide from the collected light a focused beam of light;

the lens holder defining a distal aperture optically aligned with the collimation lens and configured to emit the focused beam of light having the circular, flat-top beam profile;

wherein the distal aperture is further configured to absorb scatter laser light rays scattered from the focused beam of light.

17. A lens holder comprising:

a proximal aperture configured to receive light having a circular, flat-top beam profile from a distal aperture of a heat sink component; and a collimation lens configured to collect the light received from the heat sink component and provide from the collected light a focused beam of light;

the lens holder defining a distal aperture optically aligned with the collimation lens and configured to emit the focused beam of light having the circular, flat-top beam profile;

further comprising a chamber positioned between the collimation lens and the distal aperture, the chamber configured to allow at least a portion of the focused beam of light to converge upon reaching the distal aperture.

18. The lens holder of claim 16, wherein the collimation lens is adjustable between a first position along a center axis aligned with the light received from the heat sink component and a second position along the center axis.

19. The lens holder of claim 17 wherein the collimation lens is adjustable between a first position along a center axis aligned with the light received from the heat sink component and a second position along the center axis.

* * * * *